United States Patent
Shih

(10) Patent No.: US 10,825,799 B2
(45) Date of Patent: Nov. 3, 2020

(54) SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/367,973

(22) Filed: Mar. 28, 2019

(65) Prior Publication Data
US 2020/0203315 A1 Jun. 25, 2020

Related U.S. Application Data

(60) Provisional application No. 62/782,054, filed on Dec. 19, 2018.

(51) Int. Cl.
*H01L 23/00* (2006.01)
*H01L 25/065* (2006.01)
(Continued)

(52) U.S. Cl.
CPC ........ *H01L 25/0657* (2013.01); *H01L 23/481* (2013.01); *H01L 24/05* (2013.01); *H01L 24/16* (2013.01); *H01L 24/17* (2013.01); *H01L 24/81* (2013.01); *H01L 25/50* (2013.01); *H01L 2224/0401* (2013.01); *H01L 2224/1319* (2013.01); *H01L 2224/13144* (2013.01); *H01L 2224/13155* (2013.01); *H01L 2224/13164* (2013.01); *H01L 2224/16146* (2013.01);
(Continued)

(58) Field of Classification Search
CPC ......... H01L 24/05; H01L 24/16; H01L 24/17; H01L 24/81; H01L 25/00; H01L 25/041; H01L 25/042; H01L 25/071; H01L 25/072; H01L 25/0655; H01L 25/0753; H01L 25/065; H01L 25/50; H01L 25/0657; H01L 23/00; H01L 23/48; H01L 23/481; H01L 2225/06517; H01L 2225/06513; H01L 2225/06541; H01L 2225/06548; H01L 2224/0401; H01L 2224/16235; H01L 2224/16146; H01L 2224/17181; H01L 2224/17517; H01L 2224/11319; H01L 2224/113025; H01L 2224/0557; H01L 2224/13082; H01L 2224/32145; H01L 2224/73204; H01L 2224/81193
USPC ........................................................ 257/737
See application file for complete search history.

(56) References Cited

U.S. PATENT DOCUMENTS

| 6,992,398 B2 * | 1/2006 | Farnworth .............. B29C 70/72 257/778 |
| 2007/0066079 A1 * | 3/2007 | Kloster ............... H01L 21/3105 438/725 |

(Continued)

*Primary Examiner* — Chuong A Luu
(74) *Attorney, Agent, or Firm* — Muncy, Geissler, Olds & Lowe, P.C.

(57) ABSTRACT

The present disclosure relates to a semiconductor structure. The semiconductor structure includes a semiconductor unit, one or more bonding structures, and at least one supporter. The semiconductor unit includes at least one via. The one or more bonding structures are disposed over the semiconductor unit and electrically connected to the at least one via. The at least one supporter is disposed over the semiconductor unit. The at least one supporter is a metal block or a polymer block spaced apart from the one or more bonding structures.

19 Claims, 9 Drawing Sheets

(51) Int. Cl.
  *H01L 25/00* (2006.01)
  *H01L 23/48* (2006.01)
(52) U.S. Cl.
  CPC ............... *H01L 2224/16235* (2013.01); *H01L 2224/17181* (2013.01); *H01L 2224/17517* (2013.01); *H01L 2224/81815* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2225/06586* (2013.01)

(56) References Cited

U.S. PATENT DOCUMENTS

| | | | |
|---|---|---|---|
| 2017/0207214 A1* | 7/2017 | Or-Bach | H01L 21/6835 |
| 2018/0197862 A1 | 7/2018 | Sills et al. | |
| 2019/0088621 A1* | 3/2019 | Yang | H01L 25/0652 |

* cited by examiner

US 10,825,799 B2

SEMICONDUCTOR STRUCTURE

PRIORITY CLAIM AND CROSS REFERENCE

This application claims the priority benefit of U.S. provisional application Ser. No. 62/782,054, filed on Dec. 19, 2018. The entirety of the above-mentioned patent application is hereby incorporated by reference herein and made a part of this specification.

TECHNICAL FIELD

The present disclosure relates to a semiconductor structure, and more particularly, to a semiconductor structure having at least one supporter comprised of a metal block or a polymer block spaced apart from the bonding structure.

DISCUSSION OF THE BACKGROUND

Integrated circuit technology has undergone continuous and rapid development due to constant improvements in integration density of various electronic components (i.e., transistors, diodes, resistors, capacitors, etc.). Such improvements in integration density are primarily due to repeated reductions in minimum feature size, allowing more components to be integrated into a given chip area.

The integrated components of a semiconductor occupy volume near the surface of the semiconductor wafer. Although dramatic improvements in lithography have resulted in considerable improvement in two-dimensional (2D) integrated circuit formation, there are physical limitations to density achievable in two dimensions. One such limitation is the minimum size of the integrated components. In addition, when more devices are included on one chip, more complex designs are required. A further limitation arises from the significant increases in the number and length of interconnections between devices as the number of devices increases. As the number and length of interconnections increase, both RC delay and power consumption of the circuit increase.

Three-dimensional integrated circuits (3DIC) were thus proposed, wherein dies are stacked, with wire-bonding, flip-chip bonding, and/or through-silicon vias (TSV) being used to stack the dies together and to connect the dies to package substrates.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a semiconductor unit, one or more bonding structures, and at least one supporter. The semiconductor unit includes at least one via. The one or more bonding structures are disposed over the semiconductor unit and electrically connected to the at least one via. The at least one supporter is disposed over the semiconductor unit. The at least one supporter is typically comprised of a metal block or a polymer block spaced apart from the one or more bonding structures.

In some embodiments, the bonding structure includes a plurality of conductive posts disposed in a first region of the semiconductor unit.

In some embodiments, the supporter includes a plurality of metal posts disposed in a second region of the semiconductor unit, wherein the second region is different from the first region.

In some embodiments, the first region is a central region of the semiconductor unit.

In some embodiments, the second region is a peripheral region of the semiconductor unit, and is spaced apart from the central region.

Another aspect of the present disclosure provides a semiconductor structure. The semiconductor structure includes a semiconductor unit, one or more bonding structures, and at least one supporter. The supporter includes a plurality of polymer posts disposed in a first region of the semiconductor structure. The bonding structure includes a plurality of conductive posts disposed in the first region.

In some embodiments, the polymer posts are spaced apart from the conductive posts.

In some embodiments, the first region is a central region of the semiconductor unit.

Another aspect of the present disclosure provides a semiconductor structure. The semiconductor structure includes a semiconductor unit, one or more bonding structures, and at least one supporter. The supporter includes a plurality of polymer posts disposed in a first region and a second region of the semiconductor unit, the bonding structure includes a plurality of conductive posts disposed in the first region, and the polymer posts are spaced apart from the conductive posts.

In some embodiments, the first region is a central region of the semiconductor unit.

In some embodiments, the second region is a peripheral region of the semiconductor unit, and is spaced apart from the central region.

In some embodiments, the semiconductor structure may be further bonded to another semiconductor structure to form a three-dimensional integrated circuit (3DIC) structure, wherein one of the semiconductor structures is defined as a first semiconductor structure and the other is defined as a second semiconductor structure.

In some embodiments, the supporters of the first semiconductor structure are configured to attach the first semiconductor structure to the second semiconductor structure.

In some embodiments, a first conductive pad contacts a bottom of the one or more bonding structures, and a second conductive pad contacts a top of the one or more bonding structures, wherein a first height of each of the bonding structures between the first conductive pad and the second conductive pad is greater than a second height of the plurality of supporters.

In some embodiments, the one or more bonding structures of the first semiconductor structure extend past the plurality of supporters of the first semiconductor structure along a first direction and along a second direction perpendicular to the first direction in a top view of the 3DIC structure.

In some embodiments, the semiconductor structure may further comprise a passivation layer arranged between the plurality of supporters and the semiconductor unit, wherein the passivation layer is arranged along sidewalls of the one or more bonding structures.

In some embodiments, the semiconductor structure may further comprise a passivation layer arranged between the plurality of supporters and the semiconductor unit, wherein the one or more bonding structures respectively comprise a copper post and wherein the passivation layer is arranged along sidewalls of the copper post.

In some embodiments, the semiconductor structure may further comprise a passivation layer separating the plurality of supporters of the first semiconductor structure from the semiconductor unit.

In some embodiments, the plurality of supporters of the first semiconductor structure comprise a polymer configured to soften and melt during reflow of the one or more bonding structures.

With the above-mentioned configurations of the semiconductor device, a parasitic capacitance of the through silicon via structure is reduced because the conductive lines are separated from each other by the insulation layer, and the speed of the signal transmission through the through silicon via structure is thus increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
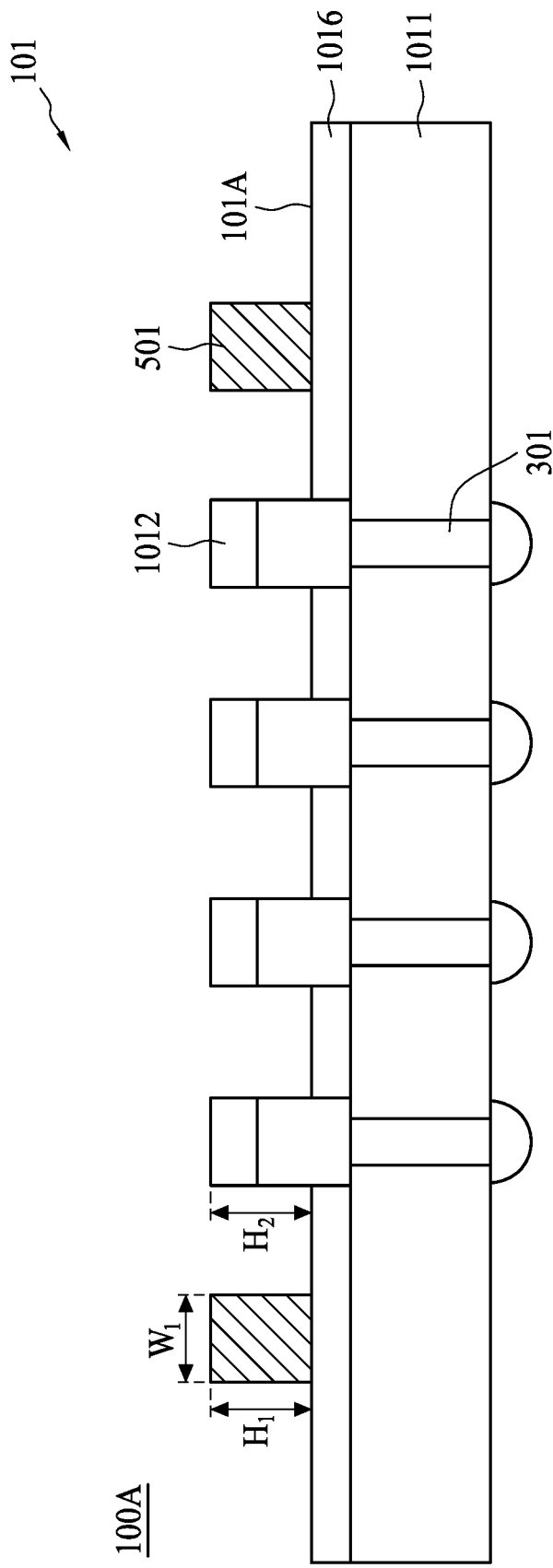
FIG. 1 is a cross-sectional view of a semiconductor structure with supporters, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a semiconductor structure 100A in accordance with some embodiments. In some embodiments, the semiconductor structure 100A includes a semiconductor unit 101. In some embodiments, a plurality of bonding structures 1012, and a plurality of supporters 501 are formed on a peripheral region of the semiconductor unit (i.e., semiconductor die) 101. In some embodiments, the semiconductor unit 101 includes a plurality of vias 301, and the bonding structures 1012 are disposed over the semiconductor unit 101 and electrically connected to at least one via 301. In some embodiments, the supporter 501 is disposed over the semiconductor unit 101. In some embodiments, the supporter 501 may be a metal block or a polymer block spaced apart from the bonding structures 1012.

In some embodiments, the bonding structure 1012 may include a nickel (Ni) layer, a palladium (Pd) layer, and a gold (Au) layer. In some embodiments, the bonding structure 1012 is comprised of electroless Ni, electroless Pd, and immersion Au (sometimes referred to as electroless-Ni/electroless-Pd/immersion-Au, or ENEPIG). In some embodiments, the bonding structures using ENEPIG layers are used for bonding and are lead-free (Pb-free). In some embodiments, the supporters 501 are formed on a surface 101A of a portion of the semiconductor unit 101 not occupied by the bonding structures 1012. In some embodiments, the supporters 501 are formed next to or near the bonding structures 1012. In some embodiments, a height $H_1$ of a supporter 501 is approximately equal to a height $H_2$ of the bonding structures 1012 above the surface 101A (or the surface of a passivation structure 1016, which is formed on a substrate 1011 of the semiconductor unit 101). In some embodiments, $H_1$ is greater than $H_2$. The supporters 501 include polymers and adhere to the surface 101A of the passivation structure 1016. In some embodiments, a width $W_1$ of a supporter 501 is in a range from about 20 µm to about 500 µm.

In some embodiments, the semiconductor unit (semiconductor die) includes a semiconductor substrate as employed in a semiconductor integrated circuit fabrication, wherein integrated circuits may be formed therein and/or thereupon. In some embodiments, the semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. In some embodiments, the semiconductor substrate may further comprise a plurality of isolation features (not shown), such as shallow trench isolation (STI) features or local oxidation of silicon (LOCOS) features. In some embodiments, the isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. In some embodiments, each semiconductor die also includes passive devices such as resistors, capacitors, inductors and the like.

In some embodiments, the supporters 501 are comprised of polymers with fillers, such as silica and/or rubber. In some embodiments, the fillers are used to provide (or enhance) strength of the supporters 501, which are placed between two semiconductor units (semiconductor dies). The examples of polymer(s) used for the supporters 501 include, but are not limited to, materials such as polyimide, polybenzoxazole (PBO), or benzocyclobutene (BCB). The polymer used for supporters 501 soften and melt during reflow of bonding structures and adhere to a substrate bonded to the semiconductor unit 101. In some embodiments, a glass transition temperature of the supporters 501 is in a range from about 40° C. to about 150° C. After the thermal reflow process, as the semiconductor unit 101 and a main substrate 200 return to room temperature, the supporters 501 retain sufficient strength to maintain the height between the semiconductor unit 101 and the main substrate 200.

Figure 2:
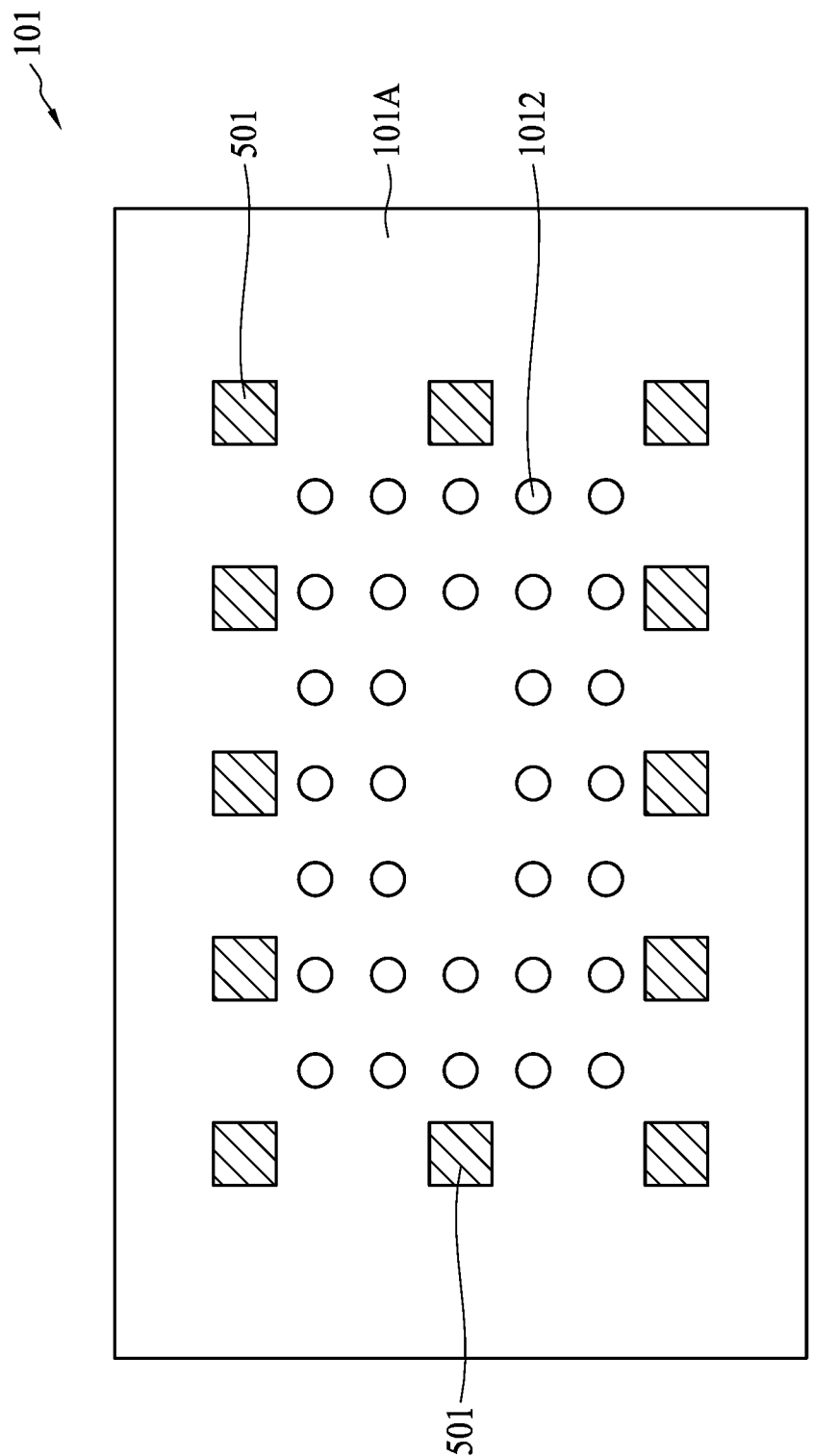
FIG. 2 is a top view of a lowermost semiconductor unit with supporters, in accordance with some embodiments of the present disclosure.

FIG. 2 is a top view of the semiconductor unit 101 in accordance with some embodiments. In some embodiments, the supporters 501 are distributed across the surface 101A of the semiconductor unit 101 and are formed on portions of the surface 101A not occupied by bonding structures 1012. Since there is limited surface space near the center of the semiconductor unit 101, the supporters 501 are arranged mostly surrounding the bonding structures 1012 which are concentrated near the center of the semiconductor unit 101. If the bonding structures are arranged differently, the supporters 501 are re-arranged accordingly.

Figure 3:
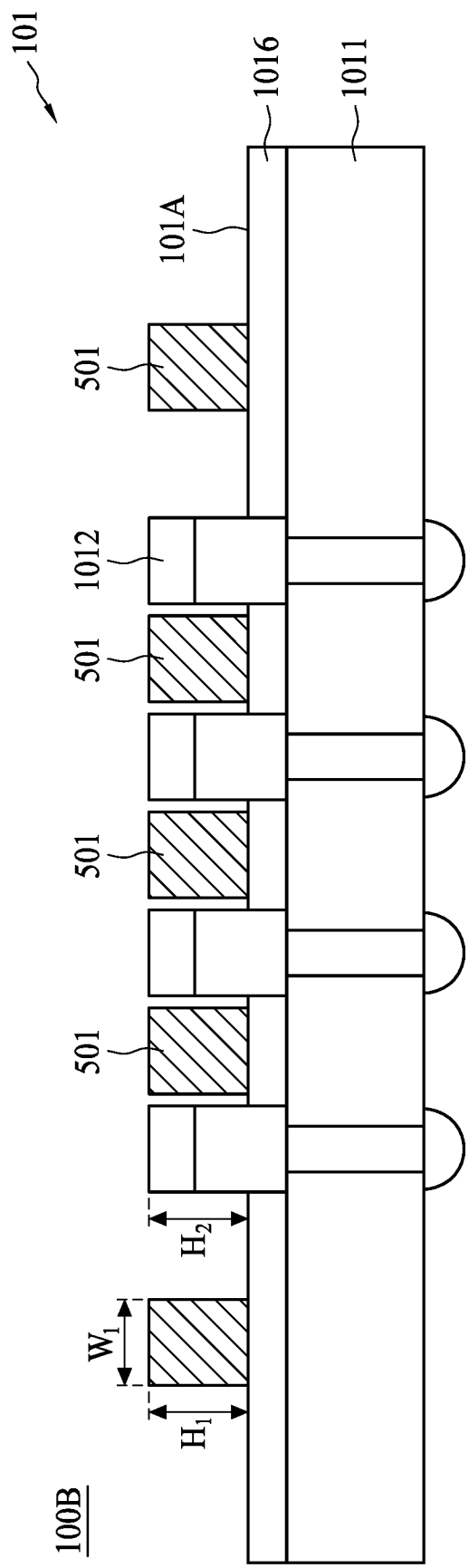
FIG. 3 is a cross-sectional view of a semiconductor structure with supporters, in accordance with some embodiments of the present disclosure.

FIG. 3 is a cross-sectional view of a semiconductor structure 100B in accordance with some embodiments. In some embodiments, the semiconductor structure 100B includes a semiconductor unit 101. In some embodiments, a plurality of bonding structures 1012, and a plurality of supporters 501 are formed on a central region and a peripheral region of the semiconductor unit (i.e., semiconductor die) 101. In some embodiments, the semiconductor unit 101 includes a plurality of vias 301, and the bonding structures 1012 are disposed over the substrate 1011 and electrically connected to the vias 301. In some embodiments, the supporter 501 is disposed over the substrate 1011. In some embodiments, the supporter 501 may be a metal block or a polymer block spaced apart from the one or more bonding structures 1012.

Figure 4:
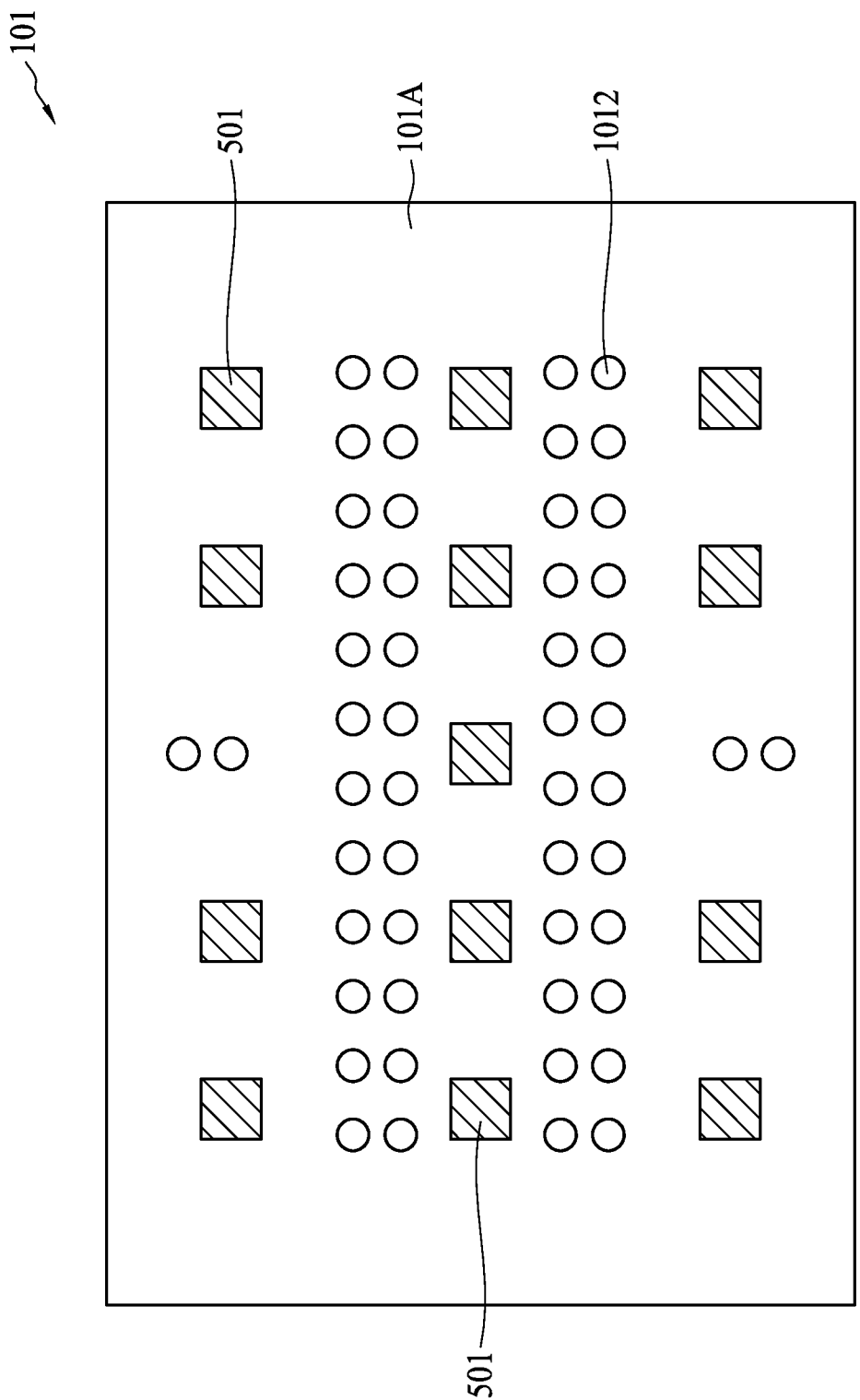
FIG. 4 is a top view of the semiconductor unit with supporters and bonding structures, in accordance with some embodiments of the present disclosure.

FIG. 4 is a top view of the semiconductor unit 101 with the supporters 501 and the bonding structures 1012, in accordance with some embodiments. In some embodiments, the bonding structures 1012 are arranged around an outer portion of the surface 101A, while some supporters 501 are placed near the center of the semiconductor unit 101 and others are placed near outer edges of the semiconductor unit 101.

In some embodiments, the supporters 501 are placed at various locations across the surface 101A of the semiconductor unit 101 to counter the effect of bowing. In some embodiments, the placement of the supporters 501 is based on the bowing of the two semiconductor units (dies) or substrates that the supporters are sandwiched between.

In some embodiments, the bonding structure formed in the central region of the semiconductor unit is comprised of a plurality of conductive posts, and the supporter formed in the peripheral region of the semiconductor unit is comprised of a plurality of metal posts. Additionally, in some embodiments, the bonding structure formed in the central region of the semiconductor unit is comprised of a plurality of conductive posts, and the supporter formed in the central region of the semiconductor and spaced apart from the conductive posts is comprised of a plurality of polymer posts. Furthermore, in some embodiments, the supporter formed in the peripheral region of the semiconductor unit and spaced apart from the conductive posts is comprised of a plurality of polymer posts.

In some embodiments, the supporters 501 in FIG. 2 have cross sections in the shapes of squares. However, in some embodiments, the supporters 501 can include other shapes, e.g., the supporter 501 in FIG. 4 can be an oval, circle, triangle, rectangle or hexagon. Other shapes are also possible.

In some embodiments, the supporters 501 may be formed on the surface 101A of the substrate 1011 by various methods. In some embodiments, the passivation layer 1016 is over the substrate 1011 and the supporters 501 are formed on the surface 101A on top of the passivation layer 1016. For example, the supporters 501 may be formed by printing (or screening) with a stencil. During the printing (or screening) process, the supporters 501 or the substrate 1011 are heated to allowed the supporters 501 to adhere to the surface 101A of the substrate 1011. The passivation layer 1016 may include one or more passivation layers. In some embodiments, the passivation layers are comprised of silicon nitride, silicon oxynitride, polymers, or combinations thereof.

Alternatively, a layer for material for the supporters 501 may be deposited on the surface 101A of the substrate 1011 prior to forming of the supporters 501. After the layer of material is deposited, the layer is then patterned by lithography and etched. Other applicable methods may also be used to form the supporters 501.

Figure 5:
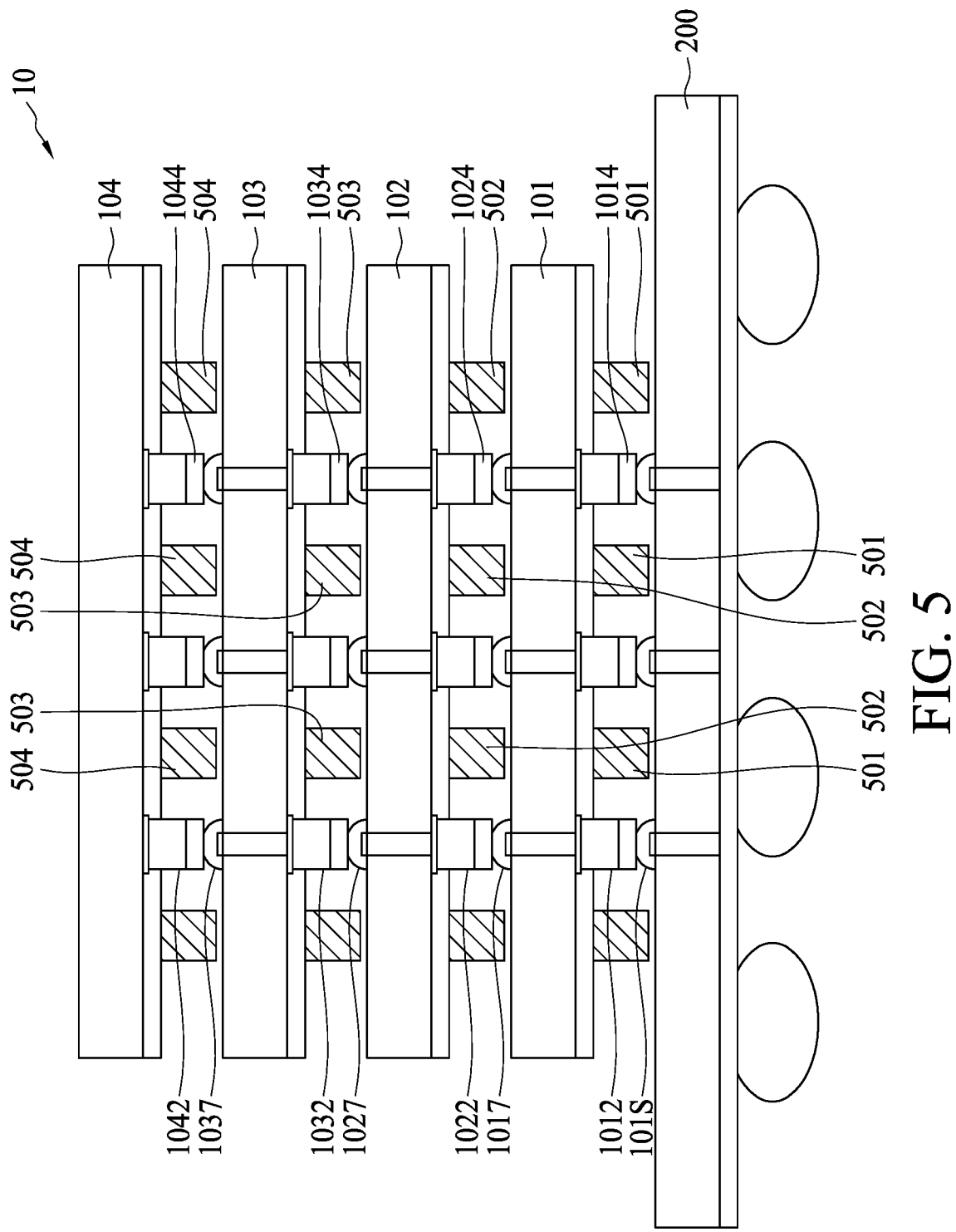
FIG. 5 is cross-sectional view of four semiconductor units (dies) and a main substrate, in accordance with some embodiments of the present disclosure.

FIG. 5 is cross-sectional view of four semiconductor units (dies) and a main substrate for forming a three-dimensional integrated circuit (3DIC) structure before a reflow process, in accordance with some embodiments. In some embodiments, supporters similar to the supporters 501 may also be formed on the semiconductor units (dies) 102, 103, and 104 by mechanisms similar to those described above. In some embodiments, after supporters 501, 502, 503, and 504 are formed on the semiconductor units (dies) 101, 102, 103, and 104, the semiconductor units (dies) 101, 102, 103, and 104 are stacked on top of each other over the main substrate 200, as shown in FIG. 5. In some embodiments, the bonding structures 1012 are aligned with connecting structures 101S of the main substrate 200, wherein the supporters 501 on the semiconductor unit (die) 101 are between the semiconductor unit (die) 101 and the substrate 200. Similarly, bonding structures 1022 of the semiconductor unit 102 are aligned with the connecting structures 1017 on the opposite side of the semiconductor unit 101 from the bonding structures 1012, wherein the supporters 502 formed on the semiconductor unit (die) 102 are between the semiconductor unit (die) 102 and the semiconductor unit (die) 101.

The bonding structures 1032 of the semiconductor unit 103 are aligned with the connecting structures 1027, and the supporters 503 are between the semiconductor unit (die) 103 and the semiconductor unit (die) 102. Similarly, the bonding structures 1042 of the semiconductor unit 104 are aligned with the connecting structures 1037, and the supporters 504 are between the semiconductor unit (die) 104 and the semiconductor unit (die) 103.

The semiconductor die may include interconnect structures or redistribution layer(s) (RDL) (not shown) to enable electrical connection between interconnects in each die and external connectors. RDLs are interconnect structures near a surface of die packages or on packaging structures to facilitate electrical connections. The semiconductor units (dies), such as the dies 101, 102, and 103, between the top die 104 and the main substrate 200, may further include through substrate vias (TSVs) and may be interposers.

In some embodiments, the substrate 200 may be comprised of a semiconductor wafer, or a portion of wafer. In some embodiments, the main substrate 200 includes silicon, gallium arsenide, silicon on insulator ("SOI") or other similar materials. In some embodiments, the main substrate 200 also includes passive devices such as resistors, capacitors, inductors and the like, or active devices such as transistors. In some embodiments, the main substrate 200 includes additional integrated circuits. In addition, the main substrate 200 may be comprised of other materials. For example, in some embodiments, the main substrate 200 is a multiple-layer circuit board. In some embodiments, the main substrate 200 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Figure 6:
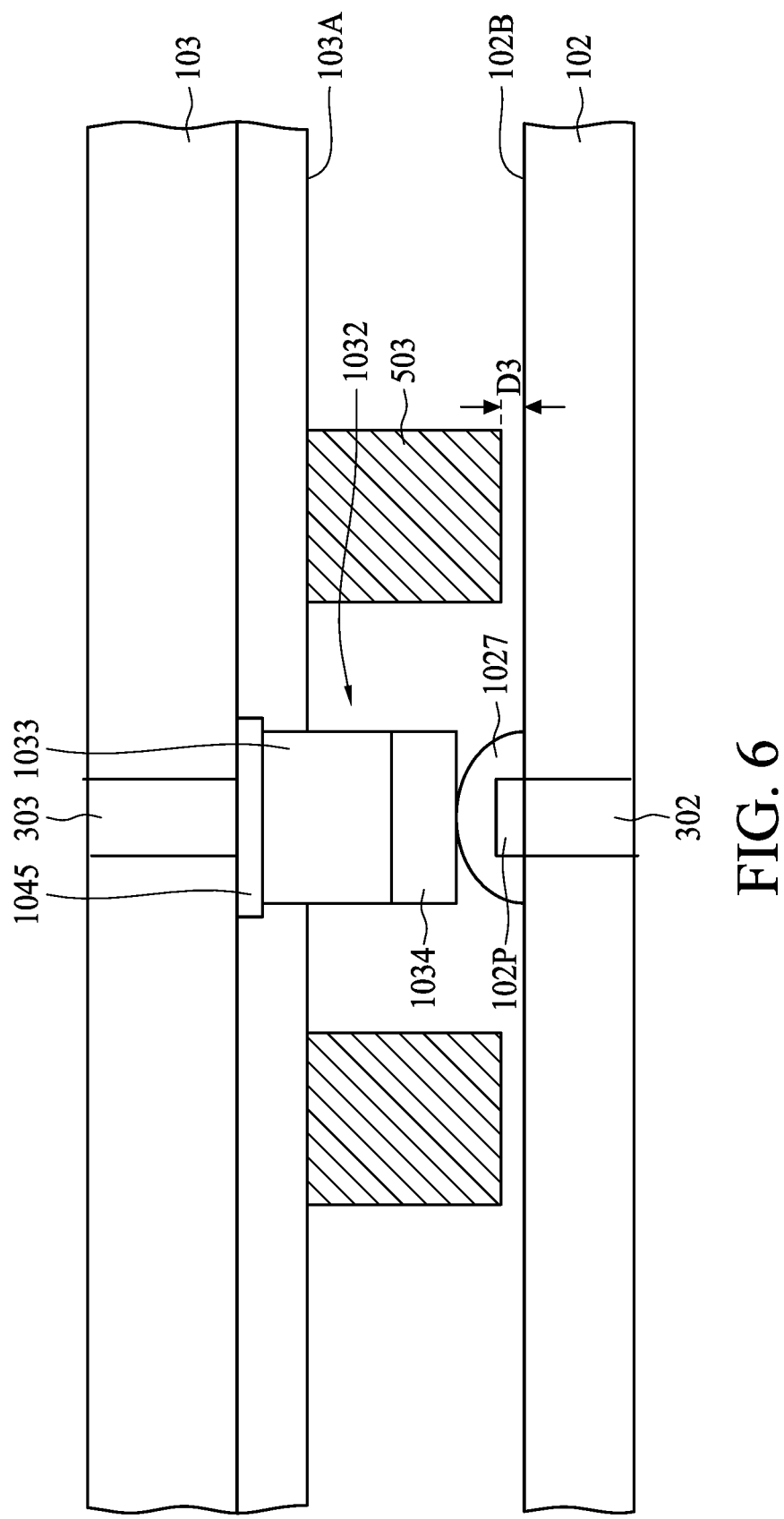
FIG. 6 is an enlarged cross-sectional view of a supporter, in accordance with some embodiments of the present disclosure.

FIG. 6 is an enlarged cross-sectional view of the supporter 503 on the semiconductor unit (die) 103 next to a bonding structure 1032 aligned with and in contact with a connecting structure 1027 of the semiconductor unit (die) 102, in accordance with some embodiments. FIG. 6 shows a gap with a distance D3 between the supporter 503 and a surface 102B of the semiconductor unit (die) 102. In some embodiments, the supporter 503 contacts the surface 102B. To provide mechanical support for the 3DIC with the semiconductor units (dies) 101, 102, 103, 104, over the main substrate 200, the supporter 503 adheres to the surface 102B after reflow. The distance D3 is in a range from about 0 nm to about 2000 nm, in accordance with some embodiments. D3 can be greater than zero, because a solder layer 1034 of the semiconductor unit (die) 103 softens and melts to cover at least a portion of the connecting structure 1027. In some embodiments, the connecting structure 1027 is formed over a metal pad 102P. Due to the softening and melting of the solder layer 1034, a height of the solder layer 1034 between a copper post 1033 and the connecting structure 1027 is reduced from a pre-reflow height, which allows the supporter 503 disposed in the peripheral region of the semiconductor unit 103 to contact the surface 102B and become adhered to the surface 102B. Furthermore, the supporter 503 disposed in the central region of the semiconductor unit 103 may be also allowed to contact the surface 102B and become adhered to the surface 102B after the softening and melting of the solder layer 1034.

Figure 7:
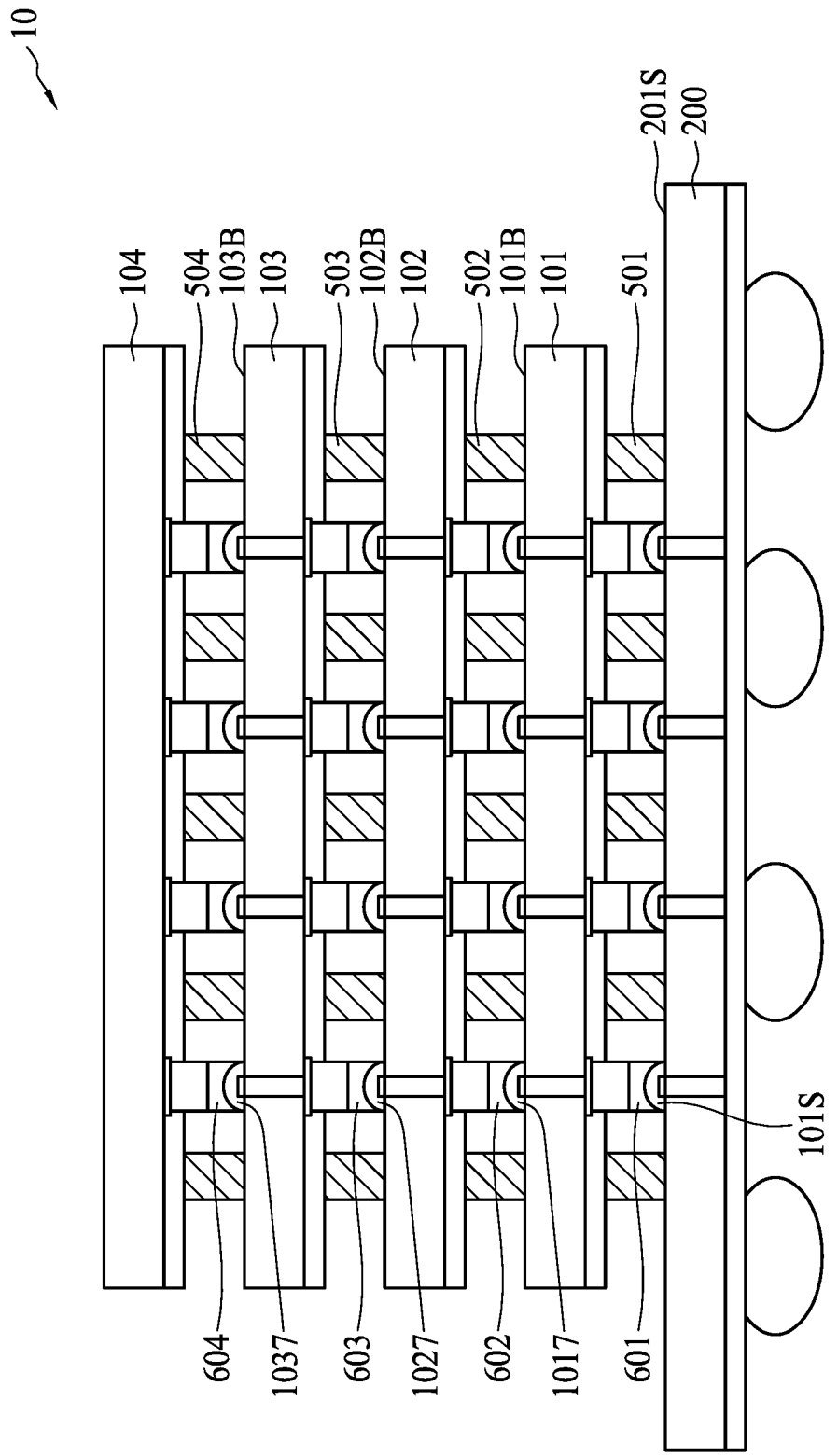
FIG. 7 is a cross-sectional view of a 3DIC structure, in accordance with some embodiments of the present disclosure.
Figure 8:
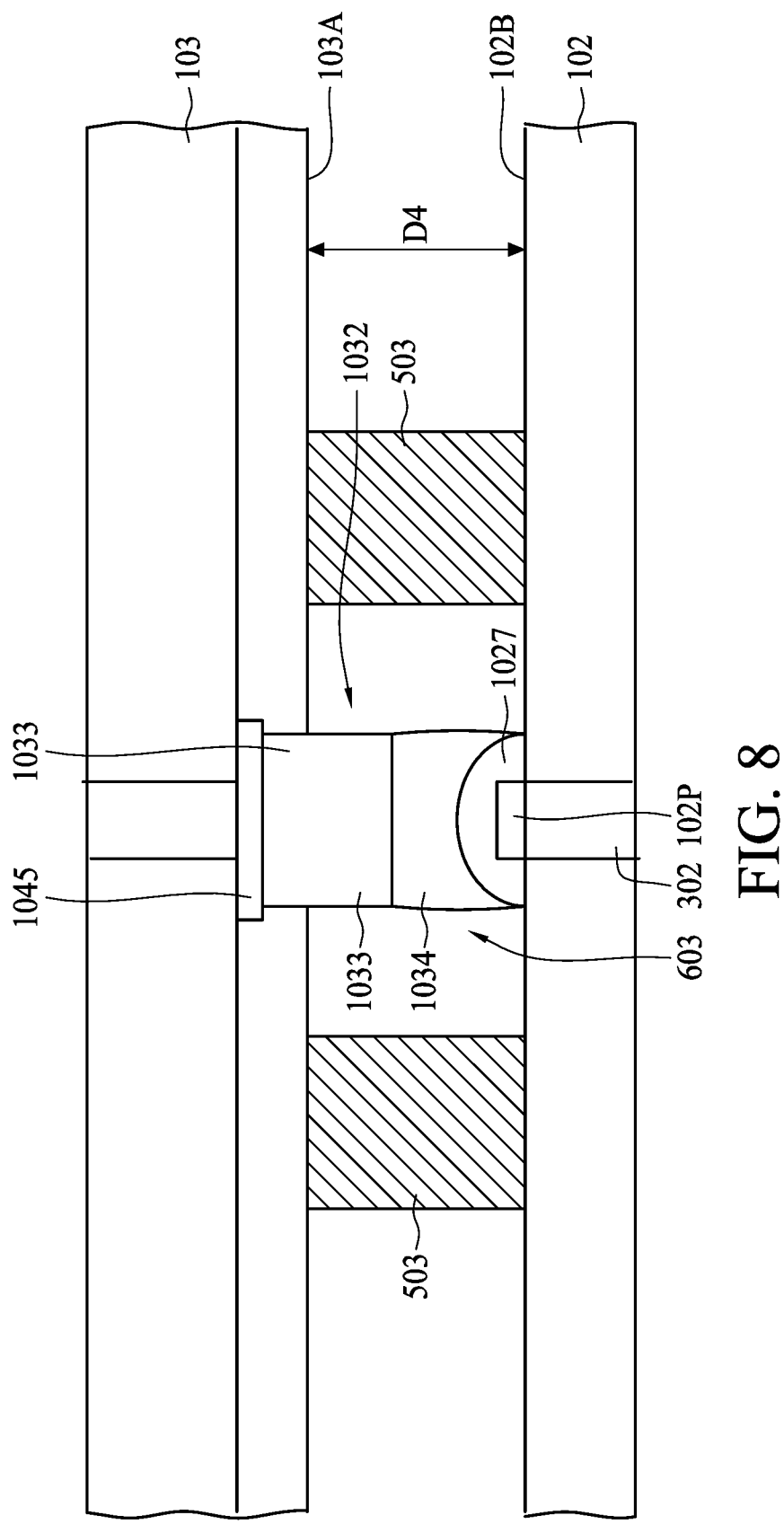
FIG. 8 is an enlarged cross-sectional view of a supporter, in accordance with some embodiments of the present disclosure.

FIG. 7 is a cross-sectional view of a 3DIC structure 10, in accordance with some embodiments. FIG. 8 is an enlarged cross-sectional view of a supporter 503 next to a bonding structure 603 between the semiconductor unit (die) 103 and the semiconductor unit (die) 102, in accordance with some embodiments. After the semiconductor units (dies) 101, 102, 103, 104 are stacked over the main substrate 200, the stacked structure undergoes a reflow process. The reflow process enables the solder layers 1014, 1024, 1034, and 1044 to bond to the connecting structure 101S, 1017, 1027, and 1037 respectively to form connecting structures 601, 602, 603, and 604, as shown in FIGS. 7 and 8, in accordance with some embodiments. The bonded semiconductor units (dies) 101, 102, 103, 104 and the main substrate 200 form a 3DIC structure 10. The reflow process also bonds the supporters 504 to the back surface 103B of the semiconductor unit (die) 103, the supporters 503 to the back surface 102B of the semiconductor unit (die) 102, the supporters 502 to the back surface 101B of the semiconductor unit (die) 101, and the supporters 501 to the back surface 201S of the main substrate 200.

The reflow process is conducted at a peak temperature in a range from about 230° C. to about 250° C., in accordance with some embodiments. For example during the reflow process, the polymer material of the supporters 503 softens and adheres to surface 102B. One end of each of the supporters 503 adheres to the surface 103A of the semiconductor unit (die) 103 and the other end of the same supporter 503 adheres to the surface 102B of the semiconductor unit (die) 102. As mentioned above, the supporters 504 include fillers used to increase strength of the supporters. Heights of the supporters 504 are maintained during the reflow process to ensure consistent distance between the semiconductor unit (die) 104 and the semiconductor unit (die) 103.

Referring to FIG. 8, a height D4 of the supporters 503 is in a range from about 10 μm to about 50 μm. The supporters 503 also relieve stress exerted on the bonding structures 603 between the semiconductor unit (die) 103 and the semiconductor unit (die) 102 and reduce the risk of cracking of the bonding structures. The supporters 503 helps to relieve stress exerted on the bonding structures 603 by absorbing forces associated with bowing of the semiconductor unit (die) 102 and the semiconductor unit (die) 103 during formation of the dies. As a result, the supporters 503 improve the yield of the 3DIC structure 10 comprising the bonded semiconductor units (dies) 101, 102, 103, 104 and the substrate 200, in comparison with a 3DIC structure that does not include supporters 503. The supporters 501, 502 and 504 perform functions similar to those provided by the supporters 503.

Figure 9:
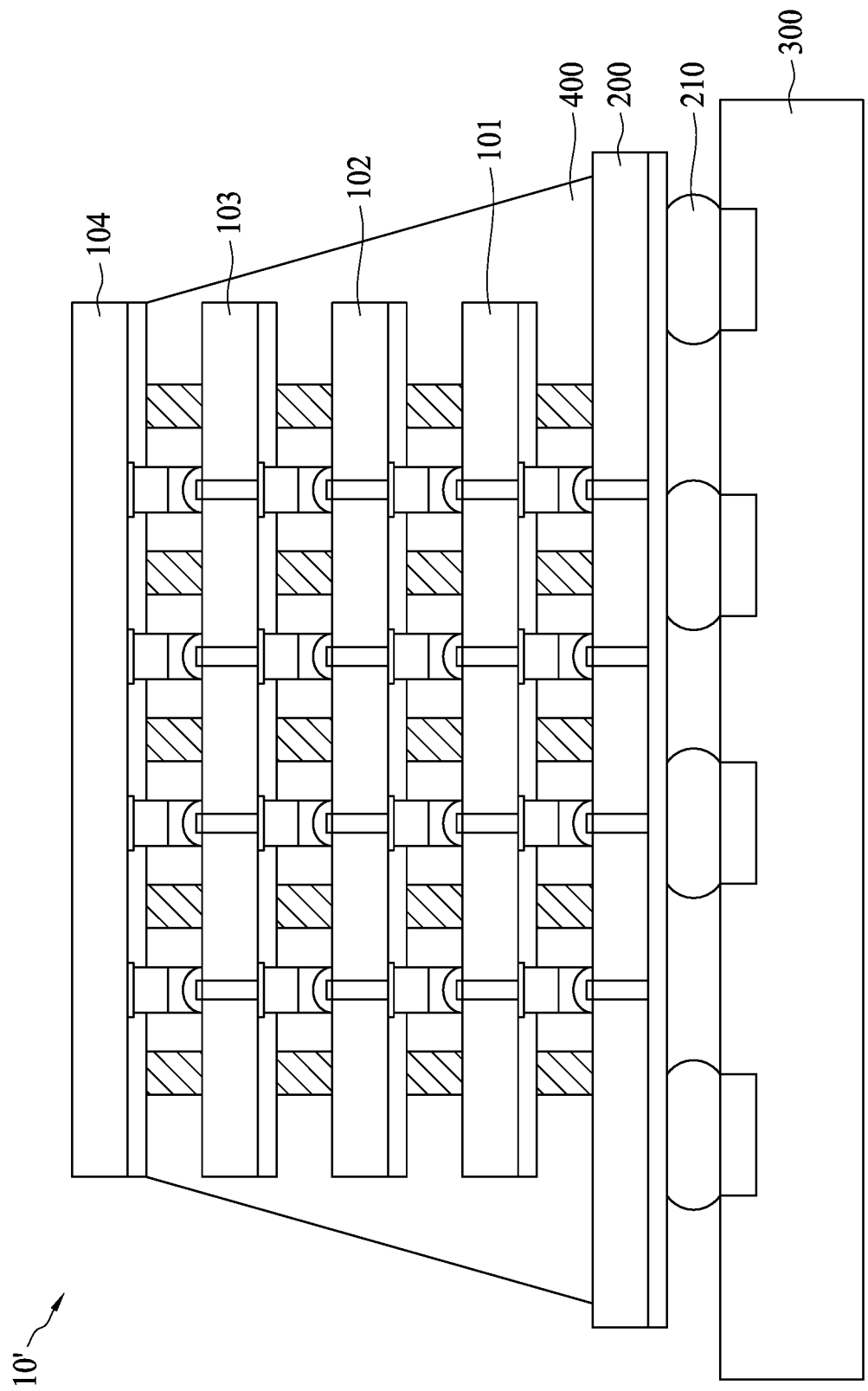
FIG. 9 is a cross-sectional view of a 3DIC structure, in accordance with some embodiments of the present disclosure.

FIG. 9 is a cross-sectional view of a 3DIC structure 10', in accordance with some embodiments. After the 3DIC structure 10 in FIG. 7 has been formed, an underfill 400 can be applied on the surface of the main substrate 200 to fill the space between the main substrate 200 and the semiconductor units (dies) 101, 102, 103, 104, as shown in FIG. 9 in accordance with some embodiments. The 3DIC structure 10 in FIG. 7 with the underfill 400 is bonded to another main substrate 300 via external connectors 210, as shown in FIG. 9.

The substrate 300 may be comprised of a semiconductor wafer, or a portion of wafer. In some embodiments, the main substrate 300 includes silicon, gallium arsenide, silicon on insulator ("SOI") or other similar materials. In some embodiments, the main substrate 300 also includes passive devices such as resistors, capacitors, inductors and the like, or active devices such as transistors. In some embodiments, the main substrate 300 includes additional integrated circuits. In addition, the main substrate 300 may be comprised of other materials. For example, in some embodiments, the main substrate 300 is a multiple-layer circuit board. In some embodiments, the main substrate 300 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

In a 3DIC structure, such as the semiconductor structure 10, the numbers of supporters between dies or between a semiconductor unit (such as a die) and a main substrate may be the same or different for different pairs of dies/substrate. The layouts and designs of the supporters are based on the shapes and severity of bowing of the dies and substrate(s). The bowing shapes of the semiconductor units (dies) 101, 102, 103, 104 described above are merely examples. The supporters 501, 502, 503 and 504 described above may be used to relieve stress and to help maintain constant height between two neighboring dies with bowing shapes that are different from those described above.

The embodiments described above provide methods and structures for forming supporters between dies and substrate(s) of a 3DIC structure. Each supporter adheres to surfaces of two neighboring dies, or surfaces of a die and a substrate, to relieve stress, caused by bowing of the die(s) and/or substrate, on the bonding structures formed between the dies or between a die and the substrate. A cost of using the supporters is much lower than costs of other processes, such as thermal compression bonding, that reduce the effect of bowing of dies and substrates on 3DIC formation. The supporters improve the yield of a 3DIC structure manufacturing process.

In some embodiments, the present disclosure relates to a three-dimensional integrated chip (3DIC) structure. The 3DIC structure comprises a first die and a second die that is bonded to the first die by one or more bonding structures. The one or more bonding structures respectively comprise a first metal pad arranged on the first die and a second metal pad arranged on the second die. A first plurality of supporters are disposed between the first die and the second die. The first plurality of supporters comprise polymers laterally spaced apart from a closest one of the one or more bonding structures. The first plurality of supporters extend below an upper surface of the second metal pad.

In some other embodiments, the present disclosure relates to a three-dimensional integrated chip (3DIC) structure. The 3DIC structure comprises a first semiconductor unit (die) and a second semiconductor unit (die) that is bonded to the first semiconductor unit (die) by a plurality of bonding structures. Each of the plurality of bonding structures comprises a copper post. A first plurality of supporters are disposed between the first semiconductor unit (die) and the second semiconductor unit (die). The first plurality of supporters comprise polymers that are laterally spaced apart from a closest one of the plurality of bonding structures. The copper post extends vertically past top surfaces of the first plurality of supporters facing the first die. In addition, the supporters may be disposed in a peripheral region of the semiconductor unit (die), and the bonding structures may be disposed in a central region of the semiconductor unit (die). Alternatively, the supporters may be disposed in the central region and the peripheral region of the semiconductor unit (die) and the bonding structures may be disposed in a central region of the semiconductor unit (die) in such a manner that the bonding structures are spaced apart from the supporters disposed in the central region.

In yet other embodiments, the present disclosure relates to a three-dimensional integrated chip (3DIC) structure. The 3DIC structure comprises a first semiconductor unit (die) and a second semiconductor unit (die) that is bonded to the first semiconductor unit (die) by one or more bonding structures. A first plurality of supporters are disposed between the first semiconductor unit (die) and the second semiconductor unit (die). The first plurality of supporters are comprised of polymers laterally spaced apart from a closest one of the one or more bonding structures. Each of the first plurality of supporters directly contacts a surface of the second semiconductor unit (die), wherein the second semiconductor unit (die) comprises a semiconductor material.

Further, one aspect of the present disclosure provides a semiconductor structure. The semiconductor structure includes a semiconductor unit, one or more bonding structures, and at least one supporter. The semiconductor unit includes at least one via. The one or more bonding structures are disposed over the semiconductor unit and are electrically connected to the at least one via. The at least one supporter is disposed over the semiconductor unit. The at least one supporter is comprised of a metal block or a polymer block spaced apart from the one or more bonding structures.

In some embodiments, the bonding structure includes a plurality of conductive posts disposed in a first region (central region of the semiconductor unit (die)), while the supporter includes a plurality of metal posts disposed in a second region (peripheral region spaced apart from the central region).

In some embodiments, the bonding structure includes a plurality of conductive posts disposed in a first region (central region of the semiconductor unit (die)), while the supporter includes a plurality of polymer posts disposed in the first region and spaced apart from the conductive posts.

In some embodiments, the supporter includes a plurality of polymer posts disposed in the second region and spaced apart from the conductive posts.

In some embodiments, when used for bonding two semiconductor units (dies), the supporter relieves stress and helps maintain a consistent height between the two bonded semiconductor units with different bowing shapes.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor structure, comprising:
a semiconductor unit having at least one via;
one or more bonding structures disposed over the semiconductor unit and electrically connected to the at least one via;
at least one supporter disposed over the semiconductor unit; and
a passivation layer arranged between the plurality of supporters and the semiconductor unit, wherein the at least one support is directly formed on a top surface of the passivation layer;
wherein the at least one supporter is a metal block or a polymer block spaced apart from the one or more bonding structures;
wherein the one or more bonding structure is disposed in a first region of the semiconductor unit, the at least one supporter is disposed in a second region of the semiconductor unit, and the first region is different from the first region.

2. The semiconductor structure of claim 1, wherein the bonding structure includes a plurality of conductive posts disposed in the first region of the semiconductor unit.

3. The semiconductor structure of claim 2, wherein the supporter includes a plurality of metal posts disposed in the second region of the semiconductor unit.

4. The semiconductor structure of claim 3, wherein the first region is a central region of the semiconductor unit.

5. The semiconductor structure of claim 4, wherein the second region is a peripheral region of the semiconductor unit that is spaced apart from the central region.

6. The semiconductor structure of claim 2, wherein the supporter includes a plurality of polymer posts disposed in the first region.

7. The semiconductor structure of claim 6, wherein the polymer posts are spaced apart from the conductive posts.

8. The semiconductor structure of claim 7, wherein the first region is a central region of the semiconductor unit.

9. The semiconductor structure of claim 2, wherein the supporter includes a plurality of polymer posts disposed in the first region and a second region of the semiconductor unit, and the polymer posts are spaced apart from the conductive posts.

10. The semiconductor structure of claim 9, wherein the first region is a central region of the semiconductor unit.

11. The semiconductor structure of claim 10, wherein the second region is a peripheral region of the semiconductor unit that is spaced apart from the central region.

12. The semiconductor structure of claim 1, wherein the semiconductor structure is further bonded to another semiconductor structure to form a three-dimensional integrated circuit (3DIC) structure, and wherein one of the semiconductor structures is defined as a first semiconductor structure and the another semiconductor structure is defined as a second semiconductor structure.

13. The semiconductor structure of claim 12, wherein the supporters of the first semiconductor structure are configured to bond the first semiconductor structure and the second semiconductor structure together.

14. The semiconductor structure of claim 1, wherein a first conductive pad contacts a bottom of the one or more bonding structures, and a second conductive pad contacts a top of the one or more bonding structures, wherein a first height of each of the bonding structures between the first conductive pad and the second conductive pad is greater than a second height of the plurality of supporters.

15. The semiconductor structure of claim 13, wherein the one or more bonding structures of the first semiconductor structure extend beyond the area occupied by the plurality of supporters of the first semiconductor structure along a first direction and along a second direction perpendicular to the first direction in a top view of the 3DIC structure.

16. The semiconductor structure of claim 1, wherein the passivation layer is arranged along sidewalls of the one or more bonding structures.

17. The semiconductor structure of claim 1, wherein the one or more bonding structures respectively comprise a copper post and wherein the passivation layer is arranged along sidewalls of the copper post.

18. The semiconductor structure of claim 13, wherein the passivation layer separates the plurality of supporters of the first semiconductor structure from the semiconductor unit.

19. The semiconductor structure of claim 13, wherein the plurality of supporters of the first semiconductor structure comprise a polymer configured to soften and melt during reflow of the one or more bonding structures.

* * * * *